United States Patent
Fan et al.

(10) Patent No.: US 11,003,030 B2
(45) Date of Patent: May 11, 2021

(54) ARRAY SUBSTRATE AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Haoxiang Fan, Beijing (CN); Keke Gu, Beijing (CN); Peng Li, Beijing (CN); Xiaoji Li, Beijing (CN); Zhe Li, Beijing (CN); Junhong Lu, Beijing (CN); Wei Zhu, Beijing (CN); Peng Qin, Beijing (CN); Wenliang Liu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

(*) Notice: Subject to any disclaimer, the term of this patent is extended or adjusted under 35 U.S.C. 154(b) by 214 days.

(21) Appl. No.: 16/098,311

(22) PCT Filed: Mar. 15, 2018

(86) PCT No.: PCT/CN2018/079194
§ 371 (c)(1),
(2) Date: Nov. 1, 2018

(87) PCT Pub. No.: WO2019/010996
PCT Pub. Date: Jan. 17, 2019

(65) Prior Publication Data
US 2020/0326599 A1    Oct. 15, 2020

(30) Foreign Application Priority Data
Jul. 11, 2017  (CN) .......................... 201710561133.X

(51) Int. Cl.
*G02F 1/1343* (2006.01)
*G02F 1/1333* (2006.01)

(52) U.S. Cl.
CPC .. *G02F 1/134363* (2013.01); *G02F 1/133345* (2013.01); *G02F 2001/134372* (2013.01); *G02F 2201/121* (2013.01); *G02F 2201/123* (2013.01)

(58) Field of Classification Search
CPC ... G02F 1/134363; G02F 2001/134372; G02F 2001/134381; G02F 1/133707
See application file for complete search history.

(56) References Cited

U.S. PATENT DOCUMENTS 6,469,765 B1    10/2002  Matsuyama et al.
7,868,985 B2    1/2011   Inoue et al.
(Continued)

FOREIGN PATENT DOCUMENTS

CN    1614482 A    5/2005
CN    103293811 A  9/2013
(Continued)

OTHER PUBLICATIONS

First Chinese Office Action dated Mar. 20, 2020, Appln No. 201710561133.
(Continued)

*Primary Examiner* — Jessica M Merlin

(57) ABSTRACT

An array substrate and a display device including the array substrate are provided. The array substrate includes: an upper electrode layer on a base substrate and including a first upper electrode strip and a second upper electrode strip; a lower electrode layer between the base substrate and the upper electrode layer. The lower electrode layer includes a portion that does not overlap the first upper electrode strip and the second upper electrode strip in a direction perpen-
(Continued)

dicular to an upper surface of the base substrate. The array substrate includes a pixel electrode strip and a common electrode strip which are in a same layer and both correspond to a region between the first upper electrode strip and the second upper electrode strip.

14 Claims, 5 Drawing Sheets

(56) References Cited

U.S. PATENT DOCUMENTS

| | | |
|---|---|---|
| 9,149,027 B2 | 10/2015 | Hyndman |
| 9,190,427 B2 | 11/2015 | Choi et al. |
| 10,197,870 B2 | 2/2019 | Liu |
| 10,419,505 B2 | 9/2019 | Danker et al. |
| 2011/0157532 A1 | 6/2011 | Nakagawa |
| 2013/0016294 A1 | 1/2013 | Li et al. |
| 2014/0132907 A1 | 5/2014 | Qin et al. |
| 2016/0370676 A1* | 12/2016 | Ono .................. G02F 1/13338 |
| 2017/0255071 A1 | 9/2017 | Yeh et al. |

FOREIGN PATENT DOCUMENTS

| | | |
|---|---|---|
| CN | 103309095 A | 9/2013 |
| CN | 103941501 A | 7/2014 |
| CN | 104765207 A | 7/2015 |
| CN | 104932159 A | 9/2015 |
| CN | 104950532 A | 9/2015 |
| CN | 105404062 A | 3/2016 |
| CN | 105652531 A | 6/2016 |
| JP | 2000356786 A | 12/2000 |
| JP | 2011017891 A | 1/2011 |
| JP | 2014178367 A | 9/2014 |

OTHER PUBLICATIONS

Extended European Search Report dated Feb. 11, 2021; Appln. No. 18788991.0.

* cited by examiner

ARRAY SUBSTRATE AND DISPLAY DEVICE

TECHNICAL FIELD

Embodiments of the present disclosure relate to an array substrate and a display device including the array substrate.

BACKGROUND

Liquid crystal display devices have been widely used in various fields such as monitors, televisions, and notebook computers. The liquid crystal display device includes a common electrode and a pixel electrode, and the deflection of the liquid crystal molecules is controlled by an electric field formed between the common electrode and the pixel electrode.

A liquid crystal display device using an ADS (Advanced Super Dimension Switch) display mode is widely used due to its wide viewing angle. In the ADS display mode, the pixel electrode and the common electrode are respectively in different layers included in the array substrate of the liquid crystal display device, thereby forming a fringe electric field between the pixel electrode and the common electrode.

Alternatively, the liquid crystal display device may employ other display modes. For example, in an IPS (In-plane Switching) display mode, the pixel electrode and the common electrode are in the same layer included in the array substrate, thereby forming an IPS electric field between the pixel electrode and the common electrode.

SUMMARY

Embodiments of the present disclosure provide an array substrate, a manufacturing method of the array substrate and a display device including the array substrate, and the array substrate improves the transmittance of the display device including the array substrate.

At least one embodiment of the present disclosure provides an array substrate including: a base substrate; an upper electrode layer, which is on the base substrate and which includes a first upper electrode strip and a second upper electrode strip; a lower electrode layer between the base substrate and the upper electrode layer, wherein the lower electrode layer includes a portion which does not overlap the first upper electrode strip and the second upper electrode strip in a direction perpendicular to an upper surface of the base substrate. The array substrate includes a pixel electrode strip and a common electrode strip which are in a same layer, and both the pixel electrode strip and the common electrode strip correspond to a region between the first upper electrode strip and the second upper electrode strip.

For example, a center position of the region between the first upper electrode strip and the second upper electrode strip corresponds to a region between the pixel electrode strip and the common electrode strip, and a distance from the center position to an edge of the first upper electrode strip is equal to a distance from the center position to an edge, close to the edge of the first upper electrode, of the second upper electrode strip.

For example, the lower electrode layer includes a first lower electrode strip and a second lower electrode strip; each of the first lower electrode strip and the second lower electrode strip includes a portion that does not overlap the first upper electrode strip and the second upper electrode strip in the direction perpendicular to the upper surface of the base substrate.

For example, the first lower electrode strip is a lower pixel electrode strip, and the second lower electrode strip is a lower common electrode strip; the first upper electrode strip is an upper common electrode strip and corresponds to the first lower electrode strip, and the second upper electrode strip is an upper pixel electrode strip and corresponds to the second lower electrode strip.

For example, a portion of the first lower electrode strip serves as the pixel electrode strip, and a portion of the second lower electrode strip serves as the common electrode strip.

For example, the first lower electrode strip includes a first protrusion portion that protrudes toward the upper electrode layer, and the first protrusion portion serves as the pixel electrode strip; the second lower electrode strip includes a second protrusion portion that protrudes toward the upper electrode layer, and the second protrusion portion serves as the common electrode strip.

For example, the array substrate further includes: a first insulating layer which includes a protrusion that supports the first protrusion portion and the second protrusion portion.

For example, a center of the protrusion corresponds to a center of the region between the first upper electrode strip and the second upper electrode strip.

For example, the array substrate further includes a second insulating layer between the lower electrode layer and the upper electrode layer, an upper surface of the second insulating layer includes a flat portion, and the flat portion corresponds to at least the first upper electrode strip, the second upper electrode strip and the region between the first upper electrode strip and the second upper electrode strip.

For example, a distance from a top end of each of the first protrusion portion and the second protrusion portion to a lower surface of the upper electrode layer is greater than or equal to 1000 angstroms.

For example, in any one of the above embodiments, the first upper electrode strip is adjacent to the second upper electrode strip, and the first lower electrode strip is adjacent to the second lower electrode strip.

For example, the pixel electrode strip and the common electrode strip are in the lower electrode layer and are both spaced apart from the first lower electrode strip and the second lower electrode strip. For example, the first upper electrode strip is adjacent to the second upper electrode strip.

For example, the pixel electrode strip and the common electrode strip are in the upper electrode layer and are both spaced apart from the first upper electrode strip and the second upper electrode strip.

For example, a ratio of a sum of a width of the pixel electrode strip, a width of the common electrode strip and a distance between the pixel electrode strip and the common electrode strip to a distance between the first upper electrode strip and the second upper electrode strip is ¼-⅓.

For example, the pixel electrode strip is adjacent to the common electrode strip.

For example, the first upper electrode strip, the second upper electrode strip, the pixel electrode strip, and the common electrode strip have a same extension direction.

At least one embodiment of the present disclosure provides a manufacturing method of an array substrate, and the method includes: forming a lower electrode layer on a base substrate; forming an upper electrode layer on the lower electrode layer, so that the upper electrode layer includes a first upper electrode strip and a second upper electrode strip. In the method, the lower electrode layer includes a portion that does not overlap the first upper electrode strip and the second upper electrode strip in a direction perpendicular to an upper surface of the base substrate. The array substrate includes a pixel electrode strip and a common electrode strip which are formed from a same film, and the pixel electrode strip and the common electrode strip both correspond to a region between the first upper electrode strip and the second upper electrode strip.

For example, the manufacturing method further includes: forming a first insulating layer that includes a protrusion. In the method, forming of the lower electrode layer includes: forming a first lower electrode strip and a second lower electrode strip. The first lower electrode strip includes a first protrusion portion formed on the protrusion, and the first protrusion portion includes the pixel electrode strip; the second lower electrode strip includes a second protrusion portion formed on the protrusion, and the second protrusion portion includes the common electrode strip.

For example, the manufacturing method further includes: forming a second insulating layer that covers the lower electrode layer before forming the upper electrode layer. In the method, an upper surface of the second insulating layer includes a flat portion corresponding to at least the first upper electrode strip, the second upper electrode strip and the region between the first upper electrode strip and the second upper electrode strip.

At least one embodiment of the present disclosure provides a display device including the array substrate of any one of the above embodiments.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
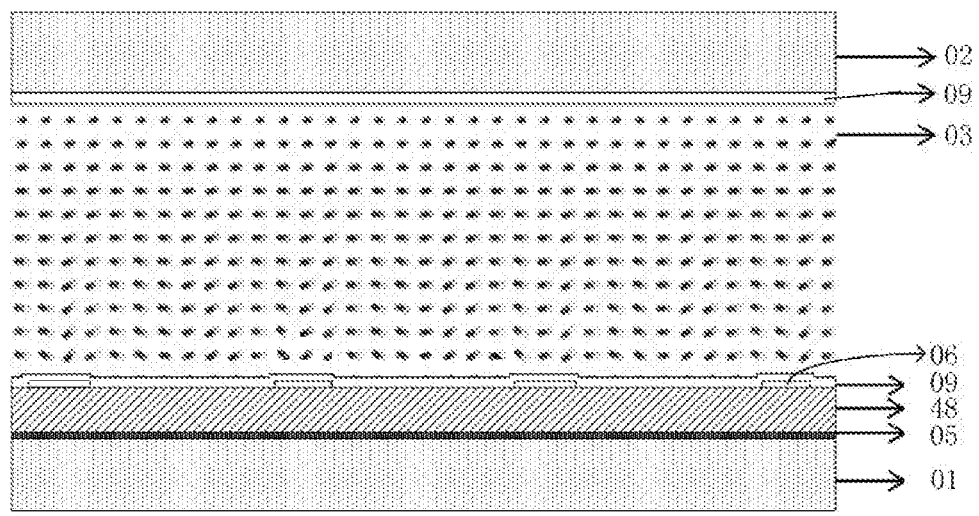
FIG. 1 is a schematic cross-sectional view of a liquid crystal display device.

FIG. 1 is a schematic cross-sectional view of an ADS mode liquid crystal display device. As shown in FIG. 1, the liquid crystal display device includes opposite substrates 01 and 02, and a plate electrode 05, an insulating layer 48 (for example, a gate insulating layer and a passivation insulating layer), a plurality of strip electrodes 06, alignment films 09 and a liquid crystal layer 03 which are between the substrates 01 and 02. One of the plate electrode 05 and the plurality of strip electrodes 06 is a common electrode and the other is a pixel electrode. During the working process of the liquid crystal display device, a common voltage is applied to the common electrode, a pixel voltage is applied to the pixel electrode, and a voltage difference exists between the common voltage and the pixel voltage, so that a fringe electric field is formed between the common electrode and the pixel electrode. The fringe electric field, for example, is used to control the deflection of the liquid crystal in the liquid crystal layer 03.

The inventors of the present application have noted in the study that: during the working process of the ADS mode liquid crystal display device shown in FIG. 1, the electric field intensities at the edges of the plurality of strip electrodes 06 are the strongest, and the transmittances at these positions are the highest; the electric fields at the intermediate positions of the gaps between the strip electrodes 06 are weak, in particular, transverse electric field components are relatively small, so the transmittances at these positions are relatively low and these positions are display weak regions of the ADS display mode.

Embodiments of the present disclosure provide an array substrate, a manufacturing method of the array substrate, and a display device including the array substrate.

In at least one embodiment of the present disclosure, as shown in FIGS. 2A, 4, 5, and 6A, the array substrate 100 includes a base substrate 10, and an upper electrode layer 60 and a lower electrode layer 50 which are on the base substrate 10. The upper electrode layer 60 includes a first upper electrode strip 61 and a second upper electrode strip 62 which are adjacent to each other. For example, the first upper electrode strip 61 and the second upper electrode strip 62 extend in substantially the same direction with a strip opening formed therebetween. The lower electrode layer 50 includes a portion that does not overlap the first upper electrode strip 61 and the second upper electrode strip 62 in a direction perpendicular to an upper surface 10a of the base substrate 10 (for example, the portion is between an edge of the first upper electrode strip 61 and an edge, adjacent to the edge of the first upper electrode strip 61, of the second upper electrode strip 62), so that a fringe electric field is formed between the lower electrode layer 50 and each of the first upper electrode strip 61 and the second upper electrode strip 62. Moreover, the array substrate includes a pixel electrode strip 71 and a common electrode strip 72 which are in the same layer and adjacent to each other, and the pixel electrode strip 71 and the common electrode strip 72 are respectively applied with a pixel voltage and a common voltage during operation and both correspond to a region between the first upper electrode strip 61 and the second upper electrode strip 62, so as to form an IPS electric field between the first upper electrode strip 61 and the second upper electrode strip 62.

In the embodiment of the present disclosure, the pixel electrode strip 71 and the common electrode strip 72 which extend substantially in the extension direction of both the first upper electrode strip 61 and the second upper electrode strip 62 are between the first upper electrode strip 61 and the second upper electrode strip 62 (that is, the first upper electrode strip 61, the second upper electrode strip 62, the pixel electrode strip 71 and the common electrode strip 72 extend substantially in the same direction) to form a transverse IPS electric field, so the embodiment of the present disclosure effectively improves the transmittance of the region between the first upper electrode strip 61 and the second upper electrode strip 62 which are adjacent to each other; such structure still has the characteristic of having the strong fringe electric field like the ADS mode, and thus the transmittance of the entire device is improved.

For example, in at least one embodiment of the present disclosure, a center position (see position A in FIG. 2A) of the region between the first upper electrode strip 61 and the second upper electrode strip 62 corresponds to a region between the pixel electrode strip 71 and the common electrode strip 72, and a distance from the center position to an edge 61a of the first upper electrode strip 61 is equal to a distance from the center position to an edge 62a, close to the edge of the first upper electrode 61, of the second upper electrode strip 62. For example, the center position of the region between the first upper electrode strip 61 and the second upper electrode strip 62 corresponds to a center position of the region between the pixel electrode strip 71 and the common electrode strip 72. In this way, it is advantageous in that the IPS electric field formed between the pixel electrode strip 71 and the common electrode strip 72 is located in the middle of the region between the first upper electrode strip 61 and the second upper electrode strip 62, thereby being more advantageous for improving the transmittance.

In the embodiment of the present disclosure, the following points need to be explained.

First, the electrode strip refers to that an electrode has a planar shape of a strip (the planar shape is a plan view shape and also a shape of an orthographic projection of the electrode strip on the base substrate 10).

Second, a component A corresponding to a component B means that there is an overlapping portion between the component A and the component B in the direction perpendicular to the upper surface 10a of the base substrate 10.

Third, the pixel electrode strip 71 and the common electrode strip 72 adjacent to each other mean that no other pixel electrode or common electrode is disposed between the two. Similarly, the first upper electrode strip 61 and the second upper electrode strip 62 adjacent to each other mean that no other upper electrode strip that is included in the upper electrode layer and extends in the extension direction of the two is disposed between the two.

Fourth, the distance from the upper electrode layer 60 to the base substrate 10 of the array substrate in the embodiment of the present disclosure is greater than the distance from the lower electrode layer 50 to the base substrate 10, that is, the base substrate 10 serves as a reference bottom surface.

Fifth, the same layer arrangement of the pixel electrode strip 71 and the common electrode strip 72 means that the two are located side by side in the same layer. For example, the pixel electrode strip 71 and the common electrode strip 72 are both in the lower electrode layer 50 (see FIGS. 2A, 4 and 5), or both in the upper electrode layer 60 (see FIG. 6A), or both in other conductive layers.

For example, in at least one embodiment of the present disclosure, the pixel electrode strip 71 and the common electrode strip 72 are both in the same transparent conductive layer or the same metal conductive layer (i.e., both formed from a film forming the conductive layer).

In the embodiment of the present disclosure, the pixel electrode strip 71 and the common electrode strip 72 are in the same pixel opening region, of the array substrate, for transmitting imaging light, and the display effect is avoided to be affected by forming the pixel electrode strip 71 and the common electrode strip 72 using the transparent conductive layer.

For example, the pixel electrode strip 71 and the common electrode strip 72 are both in the lower electrode layer 50. Some examples are specifically described below.

For example, the lower electrode layer 50 includes a first lower electrode strip 51 and a second lower electrode strip 52, each of the first lower electrode strip 51 and the second lower electrode strip 52 includes a portion that does not overlap the first upper electrode strip 61 and the second upper electrode strip 62 in the direction perpendicular to the upper surface 10a of the base substrate 10, and the portion is used to form the fringe electric field with the upper electrode layer 60. For example, the first lower electrode strip 51 corresponds to the first upper electrode strip 61 to form the fringe electric field therebetween (for example, one of the first lower electrode strip 51 and the first upper electrode strip 61 is applied with a pixel voltage and the other is applied with a common voltage), and the second lower electrode strip 52 corresponds to the second upper electrode strip 62 to form the fringe electric field therebetween (for example, one of the second lower electrode strip 52 and the second upper electrode strip 62 is applied with the pixel voltage and the other is applied with the common voltage).

Figure 2A:
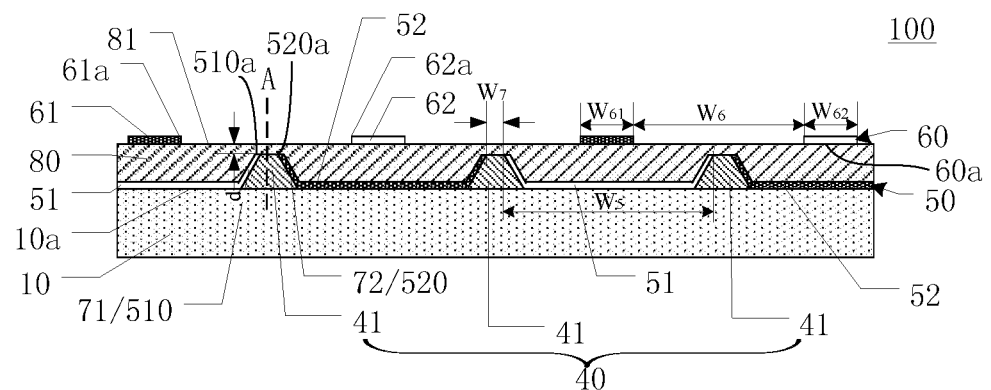
FIG. 2A is a cross-sectional view of an array substrate according to an embodiment of the present disclosure.
Figure 4:
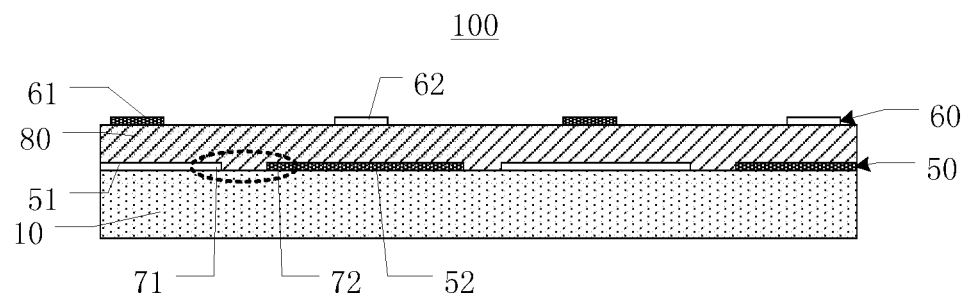
FIG. 4 is a cross-sectional view of the array substrate according to another embodiment of the present disclosure.
Figure 5:
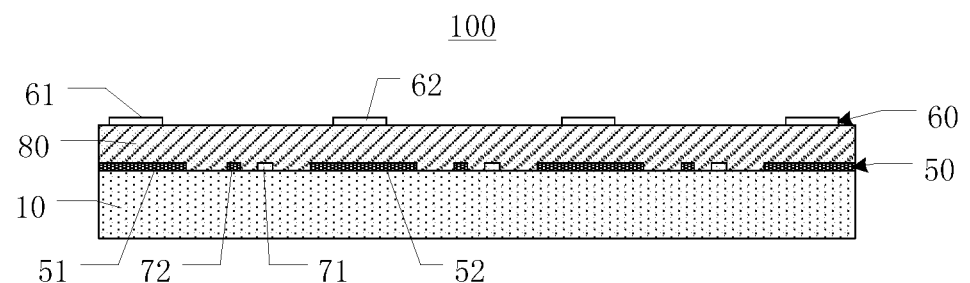
FIG. 5 is a cross-sectional view of the array substrate according to another embodiment of the present disclosure.

For example, the pixel electrode strip 71 and the common electrode strip 72 are portions of the first lower electrode strip 51 and the second lower electrode strip 52, respectively (as shown in FIGS. 2A and 4), and the portions are between the first upper electrode strip 61 and the second upper electrode strip 62; or the pixel electrode strip 71 and the common electrode strip 72 are both spaced apart from the first lower electrode strip 51 and the second lower electrode strip 52 (as shown in FIG. 5).

For example, in at least one embodiment of the present disclosure, the first lower electrode strip 51 is a lower pixel electrode strip that is input with a pixel voltage during operation, and the second lower electrode strip 52 is a lower common electrode that is input with a common voltage during operation, so that the IPS electric field is formed between the first lower electrode strip 51 and the second lower electrode strip 52; the first upper electrode strip 61 is an upper common electrode strip that is input with the common voltage during operation, and the second upper electrode strip 62 is an upper pixel electrode strip that is input with the pixel voltage during operation, so as to form the IPS electric field between the first upper electrode strip 61 and the second upper electrode strip 62. In the embodiment of the present disclosure, the fringe electric field is formed between the upper electrode layer 60 and the lower electrode layer 50, and the IPS electric field is formed between the electrode strips included in each of the upper electrode layer 60 and the lower electrode layer 50, which is more advantageous for improving the transmittance.

For example, in a situation where the First lower electrode strip 51 is the lower pixel electrode strip and the second lower electrode strip 52 is the lower common electrode strip, a portion of the first lower electrode strip 51 serves as the pixel electrode strip 71 and a portion of the second lower electrode strip 52 serves as the common electrode strip 72 (as shown in FIGS. 2A and 4).

Figure 6A:
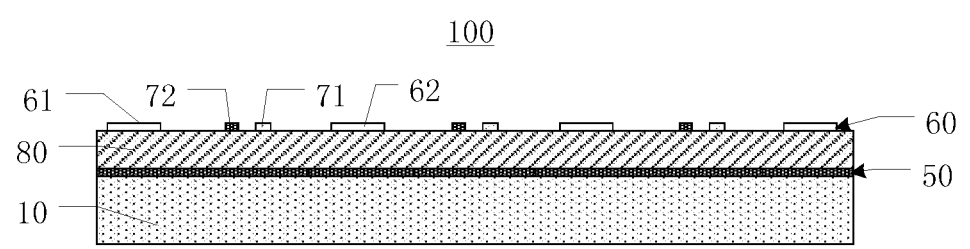
FIG. 6A is a cross-sectional view of the array substrate according to still another embodiment of the present disclosure.

For example, the pixel electrode strip 71 and the common electrode strip 72 are both in the upper electrode layer 60 and spaced apart from both the first upper electrode strip 61 and the second upper electrode strip 62 (as shown in FIG. 6A).

For example, in any one of the above embodiments of the present disclosure, each of the upper electrode layer 60 and the lower electrode layer 50 is a transparent electrode layer, and the material thereof is a transparent conductive material such as indium tin oxide, indium zinc oxide, indium gallium zinc oxide or the like. Alternatively, each of the upper electrode layer 60 and the lower electrode layer 50 is a metal electrode layer, in which case the array substrate is used, for example, in a reflective display device.

The array substrate, the manufacturing method of the array substrate and the display device provided by the embodiments of the present disclosure are described in detail below with reference to the accompanying drawings.

For example, in at least one embodiment of the present disclosure, the lower electrode layer 50 includes the first lower electrode strip 51 and the second lower electrode strip 52 which are adjacent to each other and the pixel electrode strip 71 and the common electrode strip 72 are a portion of the first lower electrode strip 51 and a portion of the second lower electrode strip 52, respectively, and each of the first lower electrode strip 51 and the second lower electrode strip 52 includes a protrusion portion and a flat portion which are connected with each other (for example, the protrusion portion and the flat portion are formed in a one-piece form).

Figure 2B:
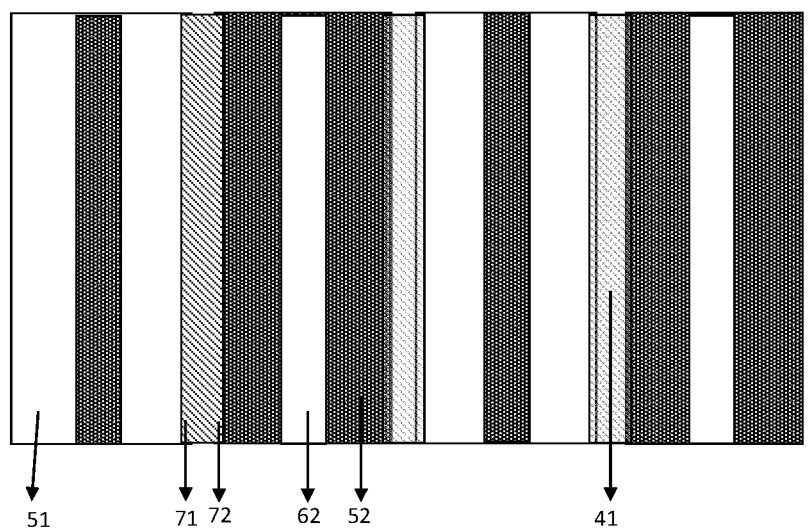
FIG. 2B is a schematic plan view of the array substrate according to the embodiment of the present disclosure.
Figure 2C:
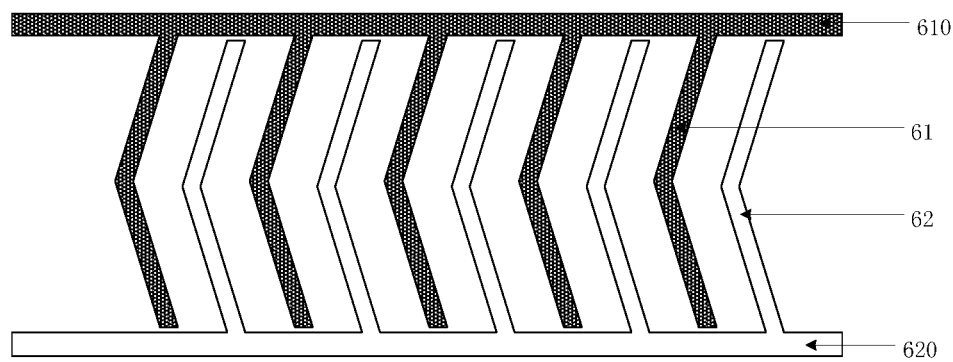
FIG. 2C is a schematic plan view of an upper electrode layer in the array substrate according to the embodiment of the present disclosure.

For example, as shown in FIGS. 2A-2C, at least one embodiment of the present disclosure provides the array substrate 100 including the base substrate 10 and the lower electrode layer 50 and the upper electrode layer 60 which are sequentially disposed on the base substrate 10.

The upper electrode layer 60 includes the first upper electrode strip 61 and the second upper electrode strip 62 which are adjacent to each other, the first upper electrode strip 61 is the upper common electrode strip and corresponds to the first lower electrode strip 51, and the second upper electrode strip 62 is the upper pixel electrode strip and corresponds to the second lower electrode strip 52. For example, as shown in FIG. 2C, the upper electrode layer 60 includes a plurality of first upper electrode strips 61, a plurality of second upper electrode strips 62, a first upper connecting portion 610 and a second upper connecting portion 620, the first upper connecting portion 610 extends along a ranking direction of the plurality of first upper electrode strips 61 and is connected with the plurality of first upper electrode strips 61, and the second upper connection portion 620 extends along a ranking direction of the plurality of second upper electrode strips 62 and is connected with the plurality of second upper electrode strips 62.

The lower electrode layer 50 includes the first lower electrode strip 51 and the second lower electrode strip 52 which are adjacent to each other. The first lower electrode strip 51 is the lower pixel electrode strip; in a direction perpendicular to the upper surface 10a of the base substrate 10, the first lower electrode strip 51 overlaps the first upper electrode strip 61 and the first lower electrode strip 51 includes a portion that extends beyond the first upper electrode strip 61, to form the fringe electric field between the first lower electrode strip 51 and the first upper electrode strip 61. Similarly, the second lower electrode strip 52 is the lower common electrode strip, and the second lower electrode strip 52 overlaps the second upper electrode strip 62 and includes a portion that extends beyond the second upper electrode strip 62, to form the fringing electric field between the second lower electrode strip 52 and the second upper electrode strip 62. In the embodiment of the present disclosure, the first lower electrode strip 51 and the second upper electrode strip 62 for example are connected together because they are both applied with the pixel voltage during operation, for example, the first lower electrode strip 51 and the second upper electrode strip 62 are connected together through a via hole; the second lower electrode strip 52 and the first upper electrode strip 61 for example are connected together because they are both applied with the common voltage during operation, for example, the second lower electrode strip 52 and the first upper electrode strip 61 are connected together through another via hole.

As shown in FIG. 2A and FIG. 2B, the first lower electrode strip 51 has a portion that is close to the second lower electrode strip 52 and serves as the pixel electrode strip 71, and the second lower electrode strip 52 has a portion that is close to the first lower electrode strip 51 and serves as the common electrode. That is, the pixel electrode strip 71 and the common electrode strip 72 are respectively portions of the first lower electrode strip 51 and the second lower electrode strip 52 in the lower electrode layer 50. Both the pixel electrode strip 71 and the common electrode strip 72 correspond to the region between the first upper electrode strip 61 and the second upper electrode strip 62, and the IPS electric field is formed at a position corresponding to the region.

For example, the center position A of the region between the first upper electrode strip 61 and the second upper electrode strip 62 is between the pixel electrode strip 71 and the common electrode strip 72. This is advantageous in that the IPS electric field formed between the pixel electrode strip 71 and the common electrode strip 72 is located in the middle of the region between the first upper electrode strip 61 and the second upper electrode strip 62, thereby contributing to an improvement in transmittance.

For example, the first lower electrode strip 51 includes a first protrusion portion 510 that protrudes toward the upper electrode layer 60 and a flat portion that is connected with the first protrusion portion 510 and is corresponding to the first upper electrode strip 61, and the first protrusion portion 510 serves as the pixel electrode strip 71 (the pixel electrode strip 71 is from the bottom end of the first protrusion portion 510 to the top end of the first protrusion portion 510); the second lower electrode strip 52 includes a second protrusion portion 520 that protrudes toward the upper electrode layer 60 and a flat portion that is connected with the second protrusion portion 520 and is corresponding to the second upper electrode strip 62, and the second protrusion portion 520 serves as the common electrode strip 72 (the common electrode strip 72 is from the bottom end of the second protrusion portion 520 to the top end of the second protrusion portion 520). In the case that the array substrate is applied to a liquid crystal display device, the upper electrode layer 60 and the lower electrode layer 50 are at the same side of the liquid crystal layer of the liquid crystal display device, and the distance from both the pixel electrode strip 71 and the common electrode strip 72 to the liquid crystal layer are relatively small due to the presence of the first protrusion portion 510 and the second protrusion portion 520, so that a relatively strong transverse electric field is formed at a position in the region between the first upper electrode strip 61 and the second upper electrode strip 62, thereby effectively improving transmittance at the position. In addition, such structure still has the characteristics of the ADS mode that the fringe electric field is relatively strong, so the transmittance of the entire display device is improved.

For example, as shown in FIGS. 2A and 2B, the array substrate 100 further includes a first insulating layer 40 that includes a protrusion 41 protruding toward the upper electrode layer 60 (three protrusions 41 are shown in FIG. 2A as an example), the protrusion 41 extends along the region between the first upper electrode strip 61 and the second upper electrode strip 62 and includes two inclined sidewalls, and the two sidewalls support the first protrusion portion 510 and the second protrusion portion 520, respectively. For example, the array substrate includes a thin film transistor, a gate insulating layer separating the gate electrode and the active layer of the thin film transistor; for example, the first insulating layer is the gate insulating layer and is formed of an organic material or an inorganic material or a laminated layer of an organic material layer and an inorganic material layer.

For example, in at least one embodiment of the present disclosure, the pixel electrode strip 71 and the common electrode strip 72 included in the lower electrode layer 50 are raised by forming the first insulating layer 40 that has the protrusion 41. In other embodiments of the present disclosure, the pixel electrode strip 71 and the common electrode strip 72 may also be raised by other means.

For example, as indicated by a broken line in FIG. 2A, the center position of the protrusion 41 substantially corresponds to the center position of the region between the first upper electrode strip 61 and the second upper electrode strip 62, and the center position of the gap between the adjacent protrusions 41 substantially corresponds to a center position of the corresponding first upper electrode strip 61 or a center position of the corresponding second upper electrode strip 62. For example, the cross-sectional shape of the protrusion 41 is a trapezoid. For example, the trapezoid has an upper edge that is close to the upper electrode layer 50 and is substantially corresponding to the center position of the region between the first upper electrode strip 61 and the second upper electrode strip 62. This is advantageous for the IPS electric field formed between the pixel electrode strip 71 and the common electrode strip 72 which are respectively deposited on the two inclined sidewalls of the protrusion 41 to correspond to the center position of the region between the first upper electrode strip 61 and the second upper electrode strip 62, so as to help increase the transmittance.

For example, in the situation where the cross-sectional shape of the protrusion 41 is the trapezoid, each of the pixel electrode strip 71 and the common electrode strip 72 further includes a portion formed at the top of the protrusion 41 to obtain a stronger IPS electric field. The embodiment of the present disclosure does not limit the shape of the protrusion 41. For example, the cross-sectional shape of the protrusion 41 is semi-circular, triangle or any other shape.

For example, as shown in FIG. 2A, the array substrate 100 further includes a second insulating layer 80 between the lower electrode layer 50 and the upper electrode layer 60, the upper surface 81 of the second insulating layer 80 includes a flat portion, and the flat portion at least corresponds to the first upper electrode strip 61, the second upper electrode strip 62 and the region between the first upper electrode strip 61 and the second upper electrode strip 62. By forming the flat portion, it is advantageous to ensure the uniformity of the electric field formed by the upper electrode layer and the lower electrode layer.

For example, the distance d from each of the top end 510a of the first protrusion portion 510 and the top end 520a of the second protrusion portion 520 to the lower surface 60a of the upper electrode layer 60 is greater than or equal to 1000 angstroms. Taking the structure shown in FIG. 2A as an example, the thickness of the second insulating layer 80 at a position corresponding to the top of the protrusion 41 is greater than or equal to 1000 angstroms. This is advantageous in preventing the pixel electrode strip 71 and the common electrode strip 72 from affecting the fringe electric field formed between the upper electrode layer and the lower electrode layer.

Examples of the sizes of the electrodes included in each electrode layer will be described below in connection with the simulation results of at least one embodiment of the present disclosure in conjunction with the TechWiz LCD software.

EXAMPLE 1

For example, as shown in FIG. 2A, the width $W_5$ of each of the first lower electrode strip 51 and the second lower electrode strip 52 is 7 μm, the distance $W_7$ between the first lower electrode strip 51 and the second lower electrode strip 52 is 1 μm, the width $W_{61}$ of the first upper electrode strip 61 and the width $W_{62}$ of the second upper electrode strip 62 are respectively 2 μm, the distance $W_6$ between the first upper electrode strip 61 and the second upper electrode strip 62 is 6 μm; the upper edge width $D_2$, the lower edge width $D_1$ and the height H ($D_2$, $D_1$ and H are not shown in FIG. 2A) of the trapezoidal section of the protrusion 41 are: $D_2$=1 μm, $D_1$=2 μm and H=0.5 μm. The liquid crystal display device shown in FIG. 1 serves as a comparison structure; as shown in FIG. 1, a width of the strip electrode 06 is 2 μm and a distance between the strip electrodes 06 is 6 μm.

Figure 3A:
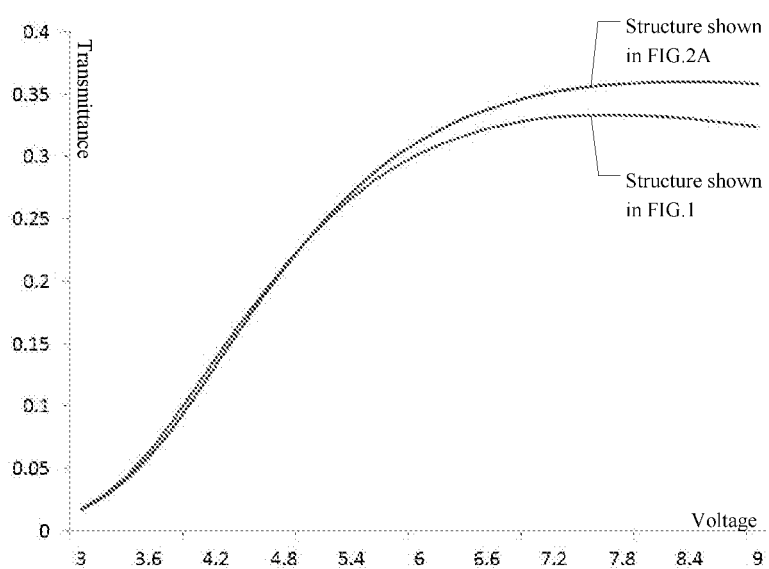
FIG. 3A is a comparison diagram of electro-optic characteristic curves of the structure shown in FIG. 2A and the structure shown in FIG. 1.

In this example, a comparison curve of the electro-optic characteristic curves (VT curves) between the structure shown in FIG. 2A and the structure shown in FIG. 1 is shown in FIG. 3A. As can be seen from FIG. 3A, the transmittance of the structure shown in FIG. 2A is significantly improved compared with that of the structure shown in FIG. 1, and the transmittance of the entire display device is increased from 0.333 to 0.36, which is about 8%.

EXAMPLE 2

For example, for the structure shown in FIG. 2A, $W_5=7$ μm, $W_7=1$ μm, $W_{61}=W_{62}=2$ μm, $W_6=6$ μm; $D_2=1$ μm, $D_1=2$ μm and H=0.3 to 0.5 μm.

Figure 3B:
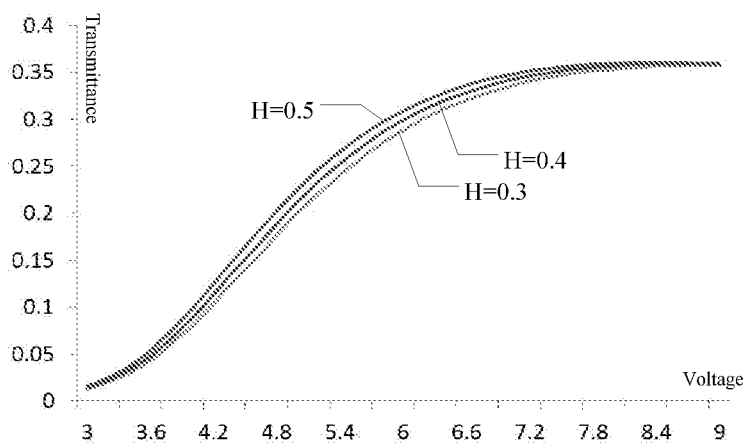
FIG. 3B is a comparison diagram of the electro-optic characteristic curves with a protrusion of the structure shown in FIG. 2A having different heights.

In this example, the electro-optical characteristic curve (VT curve) in situations where the structures have protrusions of different heights as shown in FIG. 2A is shown in FIG. 3B. As can be seen from FIG. 3B, as the height of the protrusion increases, the driving voltage slightly decreases, and the transmittance slightly increases, but the difference is not large.

For example, in at least one embodiment of the present disclosure, the lower electrode layer 50 includes the first lower electrode strip 51 and the second lower electrode strip 52, and the pixel electrode strip 71 and the common electrode strip 72 are portions of the first lower electrode strip 51 and the second lower electrode strip 52 of the lower electrode layer 50, respectively.

As shown in FIG. 4, the first lower electrode strip 51 and the second lower electrode strip 52 which are included in the lower electrode layer 50 are the lower pixel electrode strip and the lower common electrode strip, respectively; and the first upper electrode strip 61 and the second upper electrode strip 62 which are adjacent to each other and included in the upper electrode layer 60 are the upper common electrode strip and the upper pixel electrode strip, respectively. The main difference between this embodiment and the embodiment shown in FIG. 2A is that the first lower electrode strip 51 and the second lower electrode strip 52 do not include the protrusion portions, that is, the entire first lower electrode strip 51 and the entire second lower electrode strip 52 are flat: in this embodiment, the first lower electrode strip 51 has a portion that is adjacent to the second lower electrode strip 52 (the portion extends beyond the first upper electrode strip 61) and serves as the pixel electrode strip 71, and the second lower electrode strip 52 has a portion that is adjacent to the first lower electrode strip 51 (the portion extends beyond the second upper electrode strip 62) and serves as the common electrode strip 72; the pixel electrode strip 71, the common electrode strip 72, the first lower electrode strip and the second lower electrode strip are in the same layer side by side, and the IPS electric field is formed between the pixel electrode strip 71 and the common electrode strip 72.

For example, in at least one embodiment of the present disclosure, as shown in FIG. 5, the lower electrode layer 50 includes the first lower electrode strip 51, the second lower electrode strip 52, and further includes the pixel electrode strip 71 and the common electrode strip 72 which are spaced apart from both the first lower electrode strip and the second lower electrode strip. The entire pixel electrode strip 71 and the entire common electrode strip 72 correspond to the region between the first upper electrode strip 61 and the second upper electrode strip 62 which are adjacent to each other.

For example, the first lower electrode strip 51 and the second lower electrode strip 52 which are included in the lower electrode layer 50 are the lower pixel electrode strip and the lower common electrode strip, respectively; and the first upper electrode strip 61 and the second upper electrode strip 62 which are included in the upper electrode layer 60 are respectively the upper common electrode strip and the upper pixel electrode strip; or, the first lower electrode strip 51 and the second lower electrode strip 52 which are included in the lower electrode layer 50 are both lower common electrode strips, and the first upper electrode strip 61 and the second upper electrode strip 62 which are included in the upper electrode layer 60 are both upper pixel electrode strips; or, the first lower electrode strip 51 and the second lower electrode strip 52 which are included in the lower electrode layer 50 are both lower pixel electrode strips, and the first upper electrode strip 61 and the second upper electrode strip 62 which are included in the upper electrode layer 60 are both upper common electrode strips. Thus, the fringe electric field is formed between the upper electrode layer 60 and the lower electrode layer 50.

For example, in at least one embodiment of the present disclosure, the lower electrode layer 50 includes a continuous plate electrode and both the pixel electrode strip 71 and the common electrode strip 72 are in the upper electrode layer 60.

As shown in FIG. 6A, the lower electrode layer 50 includes the plate electrode, and the upper electrode layer 60 includes the first upper electrode strip 61 and the second upper electrode strip 62 which both overlap the plate electrode. The upper electrode layer 60 further includes the pixel electrode strip 71 and the common electrode strip 72 that are between the first upper electrode strip 61 and the second upper electrode strip 62, and a gap is formed between each of the pixel electrode strip 71 and the common electrode strip 72 and each of the first upper electrode strip 61 and the second upper electrode strip 62, to form the IPS electric field.

For example, the plate electrode included in the lower electrode layer 50 is the pixel electrode and each of the first upper electrode strip and the second upper electrode strip included in the upper electrode layer 60 is the common electrode; or the plate electrode included in the lower electrode layer 50 is the common electrode and each of the first upper electrode strip and the second upper electrode strip included in the upper electrode layer is the pixel electrode. This forms the fringe electric field between the upper and lower electrode layers.

Each of the first upper electrode strip and the second upper electrode strip is the pixel electrode or the common electrode, so the first upper electrode strip and the second upper electrode strip are connected with each other. For example, as shown in FIG. 6B, the upper electrode layer further includes an upper connecting portion 65 that extends in the ranking direction of the first upper electrode strip 61 and the second upper electrode strip 62 and connects with both the first upper electrode strip 61 and the second upper electrode strip 62.

Figure 6B:
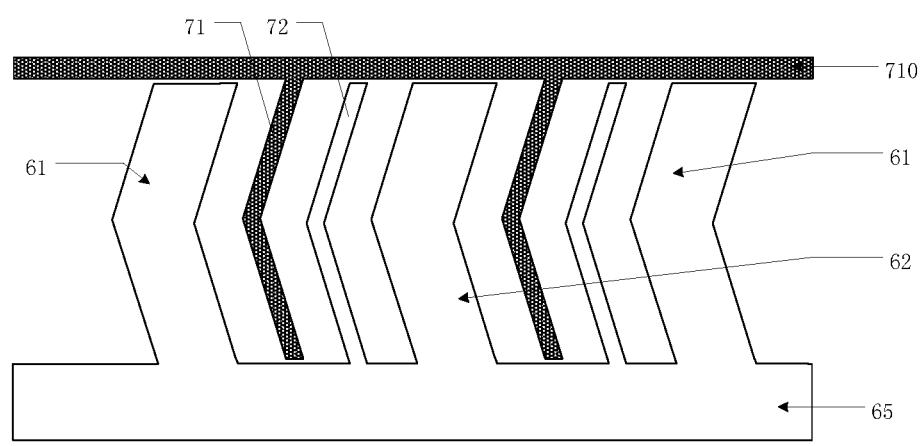
FIG. 6B is a schematic plan view of the upper electrode layer in the array substrate according to another embodiment of the present disclosure.

For example, as shown in FIG. 6B, in the situation where each of the first upper electrode strip and the second upper electrode strip is the common electrode, the common electrode strip 72 is connected with the upper connecting portion 65. For example, in the situation where each of the first upper electrode strip and the second upper electrode strip is the pixel electrode, the pixel electrode strip 71 is connected with the upper connecting portion 65.

For example, the upper electrode layer 65 includes a plurality of pixel electrode strips 71 and a connecting portion 710, and the connecting portion 710 extends in the ranking direction of the plurality of pixel electrode strips 71 and connects the plurality of pixel electrode strips 71. In this case, as shown in FIG. 6B, a group of the pixel electrode strip 71 and the common electrode strip 72 is disposed between the first upper electrode strip 61 and the second upper electrode strip 62 which are adjacent to each other.

In the embodiment of the present disclosure as shown in FIGS. 6A and 6B, the width of the pixel electrode strip 71, the width of the common electrode strip 72 and the distance between the pixel electrode strip 71 and the common electrode strip 72 are not too small in consideration of manufacturing difficulty; moreover, in order that the transmittance of the region between the first upper electrode strip 61 and the second upper electrode strip 62 is increased better, the distance between the pixel electrode strip 71 and the common electrode strip 72 is not too large. In an overall consideration, for example, along the ranking direction of the pixel electrode strip 71 and the common electrode strip 72, a ratio of the sum of the width of the pixel electrode strip 71, the width of the common electrode strip 72 and the distance between the pixel electrode strip 71 and the common electrode strip 72 to the distance between the first upper electrode strip 61 and the second upper electrode strip 62 is ¼ to ⅓.

For example, at least one embodiment of the present disclosure provides a manufacturing method of the array substrate 100, taking the array substrate shown in FIGS. 2A and 2B as an example, the method includes: forming a lower electrode layer 50 on a base substrate 10; forming an upper electrode layer 60 on the lower electrode layer 50 so that the upper electrode layer 60 includes a first upper electrode strip 61 and a second upper electrode strip 62. In the method, the lower electrode layer 50 includes a portion that does not overlap the first upper electrode strip 61 and the second upper electrode strip 62 in a direction perpendicular to an upper surface 10a of the base substrate 10; the array substrate 100 includes a pixel electrode strip 71 and a common electrode strip 72 which are formed from the same film, and the pixel electrode strip 71 and the common electrode strip 72 both correspond to a region between the first upper electrode strip 61 and the second upper electrode strip 62.

For example, the manufacturing method further includes: forming a first insulating layer 40 that includes a protrusion 41. In the method, forming of the lower electrode layer 50 includes: forming a first lower electrode strip 51 and a second lower electrode strip 52, so that the first lower electrode strip 51 includes a first protrusion portion 510 that is formed on the protrusion 41 and includes the pixel electrode strip 71, and the second lower electrode strip 52 includes a second protrusion portion 520 that is formed on the protrusion 41 and includes a common electrode strip 72.

For example, the manufacturing method further includes: forming a second insulating layer 80 that covers the lower electrode layer 50 before forming the upper electrode layer 60. In the method, an upper surface 81 of the second insulating layer 80 includes a flat portion which corresponds to at least the first upper electrode strip 61, the second upper electrode strip 62 and the region between the first upper electrode strip 61 and the second upper electrode strip 62.

For example, as shown in FIGS. 7A to 7E, the manufacturing method of the array substrate shown in FIGS. 2A and 2B includes the following steps S71 to S74.

Figure 7A:
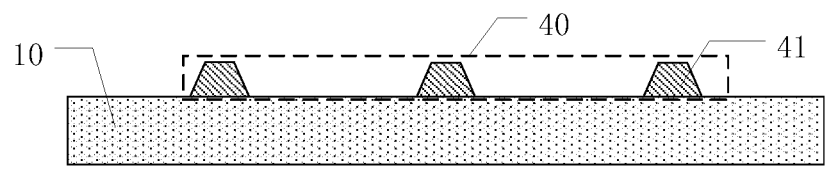
FIG. 7A to FIG. 7E are schematic views showing steps in a manufacturing method of the array substrate according to an embodiment of the present disclosure.

Step S71: as shown in FIG. 7A, the first insulating layer 40 including a plurality of protrusions 41 is formed.

Figure 7B:
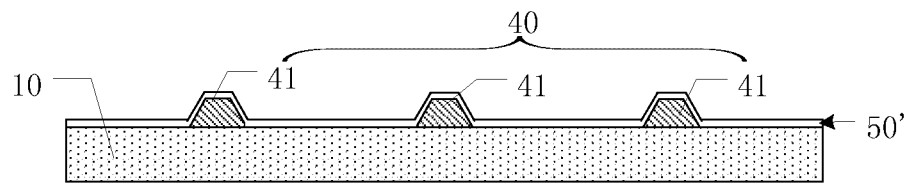
Figure 7C:
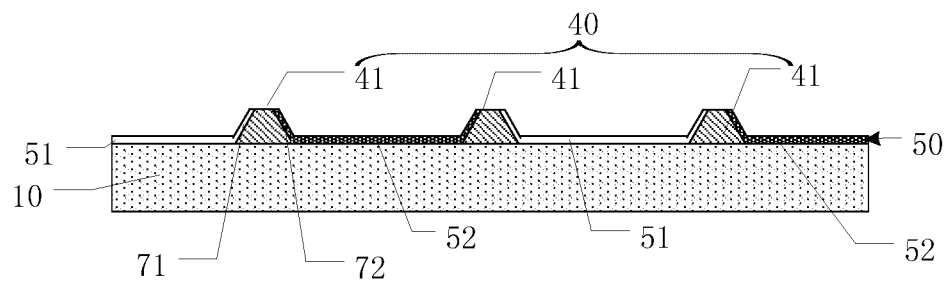

Step S72: as shown in FIG. 7B, a lower electrode film 50' covering the plurality of protrusions 41 is formed and then patterned to form the lower electrode layer 50 as shown in FIG. 7C, so that the first lower electrode strip 51 and the second lower electrode strip 52 in the lower electrode layer 50 are respectively formed on at least two sidewalls of the same protrusion 41 to obtain the pixel electrode strip 71 and the common electrode strip 72.

Figure 7D:
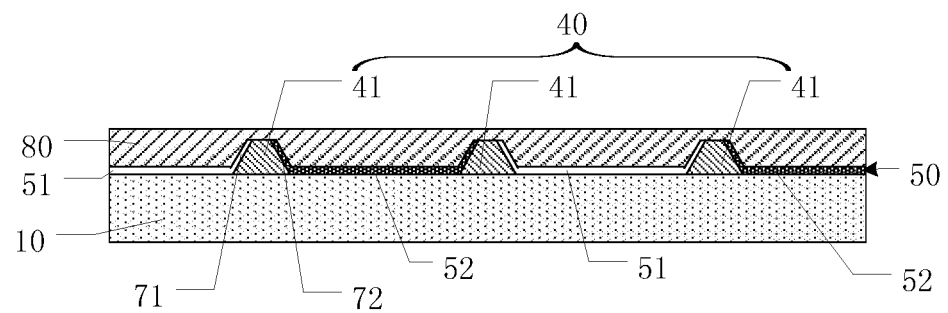

Step S73: as shown in FIG. 7D, the second insulating layer 80 covering the lower electrode layer 50 is formed.

Figure 7E:
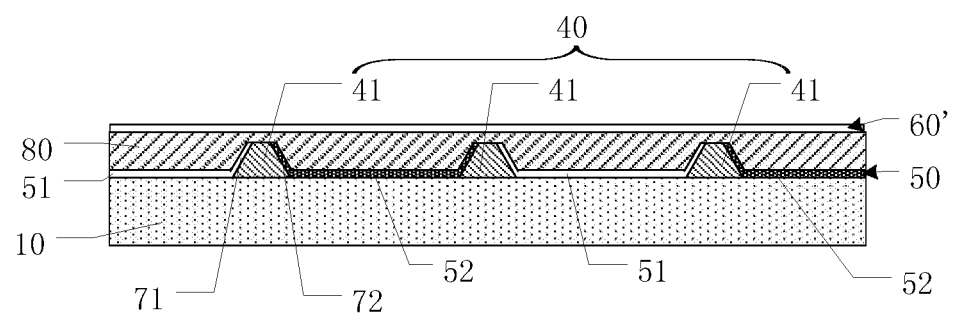

Step S74: as shown in FIG. 7E, an upper electrode film 60' covering the second insulating layer 80 is formed and then patterned to form the upper electrode layer 60 as shown in FIGS. 2A and 2B, so that the pixel electrode strip 71 and the common electrode strip 72 correspond to the region between the first upper electrode strip 61 and the second upper electrode strip 62 which are included in the upper electrode layer.

For example, at least one embodiment of the present disclosure further provides a display device including the array substrate 100 according to any one of the above embodiments.

Figure 8:
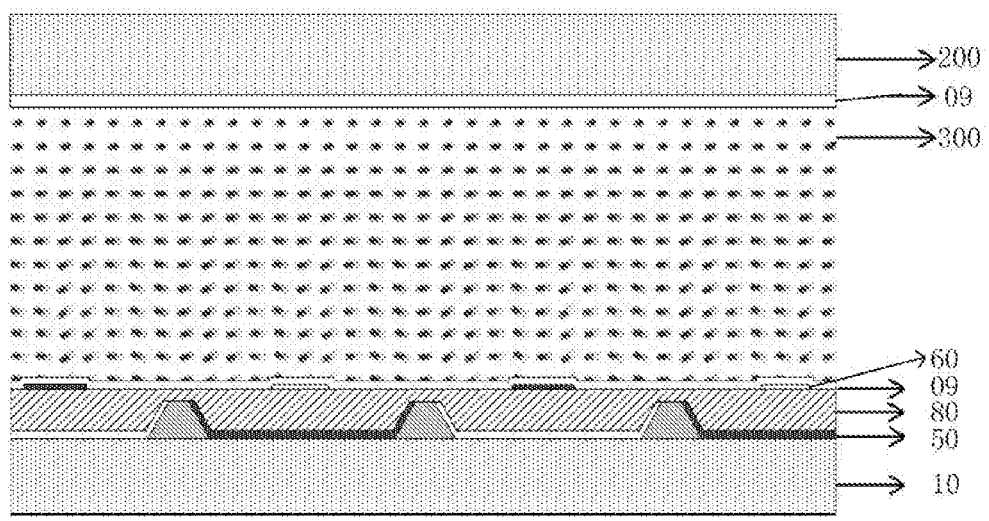
FIG. 8 is a cross-sectional view of a display device according to an embodiment of the present disclosure.

For example, as shown in FIG. 8, the display device of the embodiment of the present disclosure includes the array substrate 100 and an opposite substrate 200, the array substrate 100 and the opposite substrate 200 are opposite to each other and connected with each other by a sealant to form a liquid crystal cell in which a liquid crystal layer 300 is disposed, and alignment films 09 are disposed on two sides of the liquid crystal layer 300. The opposite substrate 200 is, for example, a color filter substrate. The pixel electrode of each pixel unit of the array substrate 100 is used to apply an electric field to control the degree of rotation of the liquid crystal material to perform a display operation. In some embodiments, the display device further includes a backlight source that provides backlight for the array substrate 100.

For example, the display device may be any product or component having a display function such as a liquid crystal panel, an electronic paper, a mobile phone, a tablet computer, a television, a display, a notebook computer, a digital photo frame, a navigator, and the like.

In the array substrate, the manufacturing method of the array substrate and the display device provided by the embodiments of the present disclosure, the pixel electrode strip and the common electrode strip that both extend along the extension direction of the first upper electrode strip and the second upper electrode strip are disposed between the first upper electrode strip and the second upper electrode strip to form the transverse IPS electric field, and thus the embodiments of the present disclosure effectively improves the transmittance of the region between the first upper electrode strip and the second upper electrode strip; and the structure still has the characteristic of the ADS mode that the fringe electric field is relatively strong, so the transmittance of the entire display device is improved.

There are the following points to be noted: (1) in the drawings of the embodiments of the present disclosure, only the structures related to the embodiments of the present disclosure are referred to, and other structures may be referred to conventional designs; (2) the thicknesses of layers or regions in the drawings used to describe the embodiments of the present disclosure are enlarged to some extent for the purpose of clarity and are not drawn according to actual scale; and (3) in the case of no conflict, the features of the embodiments and the embodiments of the present disclosure may be combined with each other.

What are described above is related to the illustrative embodiments of the disclosure only and not limitative to the scope of the disclosure; the scopes of the disclosure are defined by the accompanying claims.

This application claims the benefit of Chinese patent application No. 201710561133.X filed on Jul. 11, 2017, which is hereby entirely incorporated by reference as a part of the present application.

What is claimed is:

1. An array substrate comprising:
a base substrate;
an upper electrode layer, which is on the base substrate and which comprises a first upper electrode strip and a second upper electrode strip;
a lower electrode layer between the base substrate and the upper electrode layer, wherein the lower electrode layer comprises a portion which does not overlap the first upper electrode strip and the second upper electrode strip in a direction perpendicular to an upper surface of the base substrate,
wherein the array substrate comprises a pixel electrode strip and a common electrode strip which are in a same layer, and both the pixel electrode strip and the common electrode strip correspond to a region between the first upper electrode strip and the second upper electrode strip;
the lower electrode layer comprises a first lower electrode strip and a second lower electrode strip;
the first lower electrode strip comprises a first protrusion portion that protrudes toward the upper electrode layer, and the first protrusion portion serves as the pixel electrode strip;
the second lower electrode strip comprises a second protrusion portion that protrudes toward the upper electrode layer, and the second protrusion portion serves as the common electrode strip.

2. The array substrate according to claim 1, wherein a center position of the region between the first upper electrode strip and the second upper electrode strip corresponds to a region between the pixel electrode strip and the common electrode strip, and a distance from the center position to an edge of the first upper electrode strip is equal to a distance from the center position to an edge, close to the edge of the first upper electrode, of the second upper electrode strip.

3. The array substrate according to claim 2, wherein each of the first lower electrode strip and the second lower electrode strip comprises a portion that does not overlap the first upper electrode strip and the second upper electrode strip in the direction perpendicular to the upper surface of the base substrate.

4. The array substrate according to claim 1, wherein each of the first lower electrode strip and the second lower electrode strip comprises a portion that does not overlap the first upper electrode strip and the second upper electrode strip in the direction perpendicular to the upper surface of the base substrate.

5. The array substrate according to claim 4, wherein the first lower electrode strip is a lower pixel electrode strip, and the second lower electrode strip is a lower common electrode strip;
the first upper electrode strip is an upper common electrode strip and corresponds to the first lower electrode strip, and the second upper electrode strip is an upper pixel electrode strip and corresponds to the second lower electrode strip.

6. The array substrate according to claim 5, wherein the first upper electrode strip is adjacent to the second upper electrode strip, and the first lower electrode strip is adjacent to the second lower electrode strip.

7. The array substrate according to claim 4, wherein the pixel electrode strip and the common electrode strip are in the lower electrode layer and are both spaced apart from the first lower electrode strip and the second lower electrode strip.

8. The array substrate according to claim 7, wherein the first upper electrode strip is adjacent to the second upper electrode strip.

9. The array substrate according to claim 1, further comprising:
a first insulating layer which comprises a protrusion that supports the first protrusion portion and the second protrusion portion.

10. The array substrate according to claim 9, further comprising a second insulating layer between the lower electrode layer and the upper electrode layer,
wherein an upper surface of the second insulating layer comprises a flat portion, the flat portion corresponds to at least the first upper electrode strip, the second upper electrode strip and the region between the first upper electrode strip and the second upper electrode strip.

11. The array substrate according to claim 1, wherein a distance from a top end of each of the first protrusion portion and the second protrusion portion to a lower surface of the upper electrode layer is greater than or equal to 1000 angstroms.

12. The array substrate according to claim 1, wherein the pixel electrode strip is adjacent to the common electrode strip.

13. The array substrate according to claim 1, wherein the first upper electrode strip, the second upper electrode strip, the pixel electrode strip and the common electrode strip have a same extension direction.

14. A display device comprising the array substrate according to claim 1.

* * * * *